(12) United States Patent
An et al.

(10) Patent No.: US 8,445,300 B2
(45) Date of Patent: May 21, 2013

(54) METHOD OF FABRICATING DISPLAY DEVICE USING PLASTIC SUBSTRATE

(75) Inventors: Hyun-Jin An, Paju-si (KR); Kyoung-Mook Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 335 days.

(21) Appl. No.: 12/836,302

(22) Filed: Jul. 14, 2010

(65) Prior Publication Data

US 2011/0092006 A1    Apr. 21, 2011

(30) Foreign Application Priority Data

Oct. 21, 2009   (KR) .................... 10-2009-0100464

(51) Int. Cl.
*H01L 21/00* (2006.01)
(52) U.S. Cl.
USPC .................. 438/29; 438/34; 257/E21.158
(58) Field of Classification Search
USPC ...... 438/29, 34, 455, 458, 460, 464; 345/107; 427/58, 123; 257/E21.158
See application file for complete search history.

(56) References Cited

U.S. PATENT DOCUMENTS

| | | | |
|---|---|---|---|
| 7,091,070 B2 * | 8/2006 | Imai et al. ................. | 438/149 |
| 7,466,390 B2 * | 12/2008 | French et al. ............... | 349/158 |
| 2005/0023525 A1 | 2/2005 | Ishikawa | |
| 2008/0176477 A1 | 7/2008 | Hwang et al. | |

FOREIGN PATENT DOCUMENTS

| | | |
|---|---|---|
| EP | 1 453 086 A2 | 9/2004 |
| EP | 1890326 | 2/2008 |
| EP | 1976001 | 10/2008 |
| EP | 2 001 047 A1 | 12/2008 |
| KR | 10-2010-0068052 A | 6/2010 |
| WO | WO 2005/050754 A1 | 6/2005 |
| WO | WO 2007/083906 | 7/2007 |

OTHER PUBLICATIONS

HD Microsystems: "Pyralin Polyimide Coatings for Electronics: VM-651 and VM-652 Adhesion Promoters", Nov. 1997.

* cited by examiner

*Primary Examiner* — Chuong A Luu
*Assistant Examiner* — Nga Doan
(74) *Attorney, Agent, or Firm* — McKenna Long & Aldridge, LLP

(57) ABSTRACT

Disclosed is a method of fabricating a display device that includes: forming an adhesive layer of an inorganic material on a carrier substrate having a display area and a non-display area surrounding the display area; forming a plurality of adhesive patterns of a metallic material on the adhesive layer, each of the plurality of adhesive patterns having a width and a height; forming a plastic substrate on the adhesive layer and the plurality of adhesive patterns; forming a plurality of elements for displaying images on the plastic substrate; cutting the carrier substrate and the plastic substrate to divide the display area and the non-display area; and detaching the carrier substrate from the plastic substrate.

15 Claims, 15 Drawing Sheets

METHOD OF FABRICATING DISPLAY DEVICE USING PLASTIC SUBSTRATE

The present invention claims the benefit of Korean Patent Application No. 10-2009-0100464, filed in Korea on Oct. 21, 2009, which is hereby incorporated by reference in its entirety.

BACKGROUND OF THE INVENTION

1. Field of the Invention

The present invention relates to a method of fabricating a display device, and more particularly, to a method of fabricating a display device using a flexible plastic substrate.

2. Discussion of the Related Art

Display devices typically include liquid crystal display (LCD) devices, plasma display panel (PDP) devices and organic electroluminescent display (OELD) devices. Recently, various display devices have been suggested to satisfy diverse users' need. Specifically, display devices having a light weight, a thin profile and a high efficiency and providing a full color moving image have been widely researched by virtue of enhancement and portability in utilization of information.

An electrophoretic display (EPD) device has been the subject of recent research due to its portability. Since the EPD device does not require a polarizing plate, a backlight unit and a liquid crystal layer, the fabrication cost of the EPD device is reduced.

FIG. 1 is a cross-sectional view showing an electrophoretic display device according to the related art.

In FIG. 1, an electrophoretic display device 1 includes first and second substrates 11 and 36 and an ink layer 57 between the first and second substrates 11 and 36. The ink layer 57 includes a plurality of capsules 63, and each capsule 63 includes a plurality of white pigments 59 and a plurality of black pigments 61. The plurality of white pigments 59 and the plurality of black pigments 61 are charged by condensation polymerization (polycondensation). For example, the plurality of white pigments 59 may be charged negatively and the plurality of black pigments 61 may be charged positively. The plurality of capsules 63 may have a uniform size through a filtering process. A plurality of pixel electrodes 28 connected to a plurality of thin film transistors (TFTs) (not shown) are formed on the first substrate 11. One of a positive voltage (+) and a negative voltage (−) is selectively supplied to each of the plurality of pixel electrodes 28 by the plurality of TFTs. The EPD device 1 utilizes an ambient light including a natural light and an indoor light as a light source, and the plurality of pixel electrodes 28 induce the movement of the plurality of white pigments 59 and the plurality of black pigments 61, thereby displaying images or texts.

When an electric field generated by the positive voltage (+) and the negative voltage (−) is applied to the ink layer 57, the plurality of white pigments 59 and the plurality of black pigments 61 move to the plurality of pixel electrodes 28 having an opposite polarity. For example, when the positive voltage (+) is applied to the plurality of pixel electrodes 28 in a pixel region, the plurality of white pigments 59 may move to the plurality pixel electrodes 28 and the plurality of black pigments 61 may move to the second substrate 36, thereby the pixel region displaying a black image. In addition, when the negative voltage (−) is applied to the plurality of pixel electrodes 28 in the pixel region, the plurality of black pigments 61 may move to the plurality of pixel electrodes 28 and the plurality of white pigments 59 may move to the second substrate 36, thereby the pixel region displaying a white image.

The EPD device 1 may be fabricated through an array process and a film deposition process. The plurality of TFTs and the plurality of pixel electrodes 28 are formed on the first substrate 11 through the array process, and an electrophoretic film (not shown) is attached to the first substrate having the plurality of TFTs and the plurality of pixel electrodes 28 through the film deposition process.

The EPD device may be widely used as an electronic book (e-book) or an electronic paper (e-paper) due to their low power consumption, light weight and thin profile. Specifically, when the EPD device is used as an e-paper, flexibility is required for portability. As a result, the EPD device includes a plastic substrate having a thickness of about 10 μm to about 200 μm as a base substrate for the purpose of maximizing the flexibility. Since the plastic substrate is too flexible to have a sufficient flatness on a stage during a fabrication process for the EPD device, the fabrication process is performed to the plastic substrate attached to an additional carrier substrate and the carrier substrate is removed after the fabrication process, thereby the EPD device completed.

FIGS. 2A to 2D are cross-sectional views showing a fabrication process of an array substrate for an electrophoretic display device according to the related art.

In FIG. 2A, an ablation layer 7 is formed on a carrier substrate 5 having a display area DA by depositing hydrogenated intrinsic amorphous silicon (a-Si:H). The carrier substrate 5 may be a glass substrate through which a laser beam can penetrate.

In FIG. 2B, a plastic substrate 11 is formed on the ablation layer 7 by sequentially coating and heating liquid plastics.

In FIG. 2C, a plurality of gate lines (not shown), a plurality of data lines 19, a thin film transistor (TFT) Tr and a pixel electrode 28 are formed on the plastic substrate 11. The plurality of gate lines cross the plurality of data lines 19, and the TFT Tr includes a gate electrode 14, a gate insulating layer 13, a semiconductor layer 18 including an active layer 18a and an ohmic contact layer 18b, a source electrode 20 and a drain electrode 22. In addition, the pixel electrode 28 is connected to the drain electrode 22.

In FIG. 2D, a laser beam LB from a laser apparatus 99 is irradiated onto an outer surface of the ablation layer 7 through the carrier substrate 5, and hydrogen (H), such as hydrogen gas erupts from the hydrogenated intrinsic amorphous silicon of the ablation layer 7. As a result, the plastic substrate 11 having the TFT Tr is detached from the carrier substrate 5.

Although not shown, a film deposition process is performed to the plastic substrate 11 detached from the carrier substrate 5. For example, an electrophoretic film including an ink layer and a common electrode may be attached to the plastic substrate having the TFT Tr and a protecting film may be attached to the electrophoretic film through the film deposition process, thereby an electrophoretic display (EPD) device is completed.

In the fabrication process for an EPD according to the related art, however, since the laser apparatus 99 having a relatively high price is used to detach the plastic substrate 11 from the carrier substrate 5, the fabrication cost for the EPD device increases. In addition, since it may take about 10 minutes to about 30 minutes to irradiate the whole carrier substrate 5 with the laser beam LB, the productivity is reduced. Further, since irradiation of the laser beam LB causes deterioration of the TFT Tr and break of the plurality of gate lines and the plurality of data lines 19, the production yield is reduced.

SUMMARY OF THE INVENTION

Accordingly, the present invention is directed to a method of fabricating a display device that substantially obviates one or more of the problems due to limitations and disadvantages of the related art.

An object of the present invention is to provide a method of fabricating a display device where fabrication cost is reduced and productivity and production yield are improved by detaching a plastic substrate from a carrier substrate without using a laser apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating a display device comprises: forming an adhesive layer of an inorganic material on a carrier substrate having a display area and a non-display area surrounding the display area; forming a plurality of adhesive patterns of a metallic material on the adhesive layer, each of the plurality of adhesive patterns having a width and a height; forming a plastic substrate on the adhesive layer and the plurality of adhesive patterns; forming a plurality of elements for displaying images on the plastic substrate; cutting the carrier substrate and the plastic substrate to divide the display area and the non-display area; and detaching the carrier substrate from the plastic substrate, wherein the adhesive force of the adhesive layer to the carrier substrate is weaker than the adhesive force of the adhesive patterns to the carrier substrate.

Further, the carrier substrate may be made of glass, the inorganic material may include one of silicon oxide ($SiO_2$) and silicon nitride (SiNx), and the metallic material may include one of molybdenum (Mo), molybdenum tungsten (MoW), aluminum (Al), aluminum alloy, copper (Cu), molybdenum titanium (MoTi), amorphous indium-tin-oxide (a-ITO) and indium-gallium-zinc-oxide (IGZO).

Further, the width may be within a range of about 1 μm to about 500 μm, and the height may be within a range of about 50 Å to about 150 Å.

Further, an area ratio of the plurality of adhesive patterns to the display area may be within a range of about 1% to about 10%.

Further, an average adhesive force between the carrier substrate and the plastic substrate may be within a range of about 10 $gf/cm^2$ to about 100 $gf/cm^2$.

Moreover, each of the plurality of adhesive patterns may have a rectangular ring shape in the non-display area to surround the display area.

Further, each of the plurality of adhesive patterns may be arranged in a manner of stripe or matrix shape.

Further, forming the plurality of elements may comprise: forming a gate line, a data line crossing the gate line to define a pixel region and a thin film transistor on the plastic substrate, the thin film transistor including a gate electrode, a gate insulating layer, a semiconductor layer, a source electrode and a drain electrode; forming a passivation layer on the thin film transistor, the passivation layer having a drain contact hole exposing the drain electrode; and forming a pixel electrode in the pixel region on the passivation layer, the pixel electrode connected to the drain electrode through the drain contact hole.

Further, forming the plurality of elements further comprises: forming an electrophoretic film on the pixel electrode; forming a color filter layer on the electrophoretic film; and forming a protecting layer on the color filter layer.

Further, the electrophoretic film may include an bonding layer on the pixel electrode, an ink layer on the bonding layer, a common electrode on the ink layer and a base film on the common electrode, the ink layer including a plurality of capsules each having a plurality of white pigments and a plurality of black pigments charged by condensation polymerization.

In another aspect, a method of fabricating a display device includes: forming an adhesive adjusting layer of an adhesive improving material on a carrier substrate having a display area and a non-display area surrounding the display area, the adhesive improving material including an amino silane material and an organic solvent; forming a plastic substrate on the adhesive adjusting layer; forming a plurality of elements for displaying images on the plastic substrate; cutting the carrier substrate and the plastic substrate to divide the display area and the non-display area; and detaching the carrier substrate from the plastic substrate.

Further, the method of fabricating a display device may further comprise drying the adhesive adjusting layer before forming the plastic substrate.

Further, the adhesive improving material may include about 0.1% to about 10% by weight of the amino silane material and about 90% to about 99.9% by weight of the organic solvent.

Further, the adhesive adjusting layer may be formed in the non-display area with one process selected from spraying, coating and rolling.

Further, the adhesive adjusting layer may be formed in the whole display area with a spray.

Further, forming the plurality of elements may comprise: forming a gate line, a data line crossing the gate line to define a pixel region and a thin film transistor on the plastic substrate, the thin film transistor including a gate electrode, a gate insulating layer, a semiconductor layer, a source electrode and a drain electrode; forming a passivation layer on the thin film transistor, the passivation layer having a drain contact hole exposing the drain electrode; and forming a pixel electrode in the pixel region on the passivation layer, the pixel electrode connected to the drain electrode through the drain contact hole.

In another aspect, a method of fabricating a display device includes: forming an inorganic material layer on a carrier substrate having a display area and a non-display area surrounding the display area; forming an adhesive pattern on the inorganic material layer, the adhesive pattern is configured to reinforce an adhesive force of the inorganic material layer to a plastic; forming a plastic substrate on the inorganic material layer and the adhesive pattern; forming a plurality of elements for displaying images on the plastic substrate; dividing the display area and the non-display area; and detaching the carrier substrate from the plastic substrate.

Further, the adhesive pattern may be made of metal material.

Further, the adhesive pattern may be arranged in a dot shape.

Further, an area ratio of the adhesive pattern to the display area may be within a range of about 1% to about 10%.

Further, the adhesive pattern may have a radius of about 1 μm to about 500 μm.

It is apparent to those skilled in the art that various modifications, variations and combinations can be made based on the above features.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
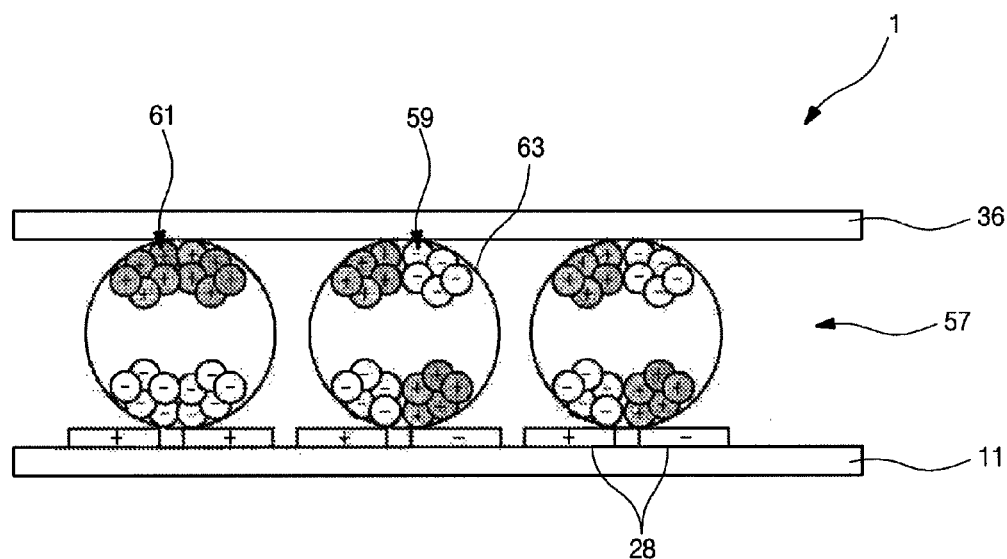
FIG. 1 is a cross-sectional view showing an electrophoretic display device according to the related art.
Figure 2A:
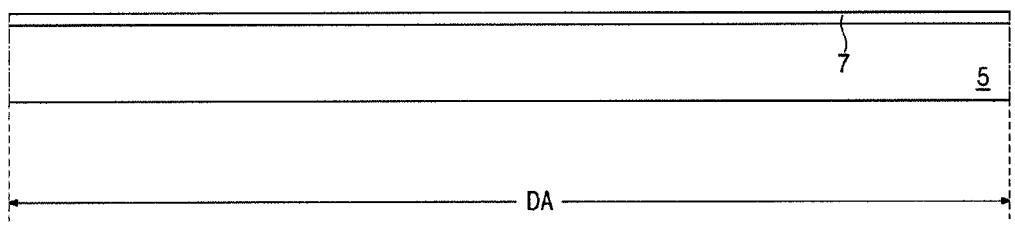
FIGS. 2A to 2D are cross-sectional views showing a fabrication process of an array substrate for an electrophoretic display device according to the related art.
Figure 2B:
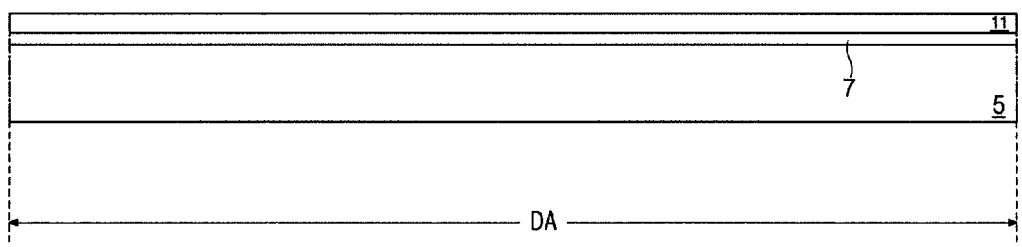
Figure 2C:
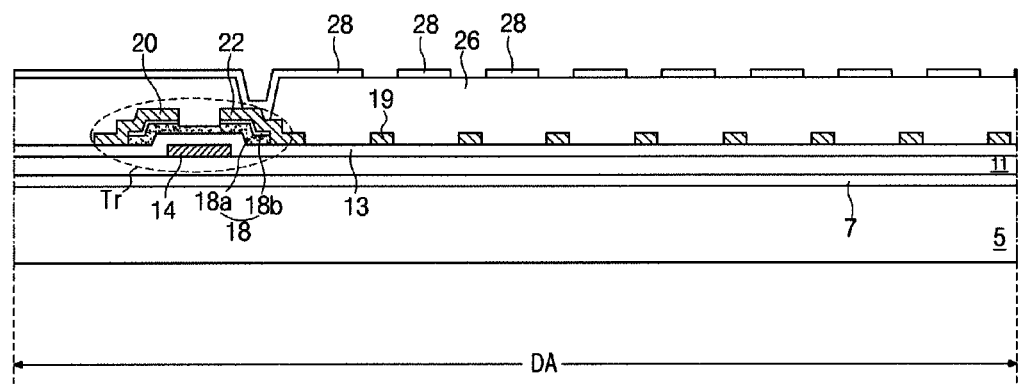
Figure 2D:
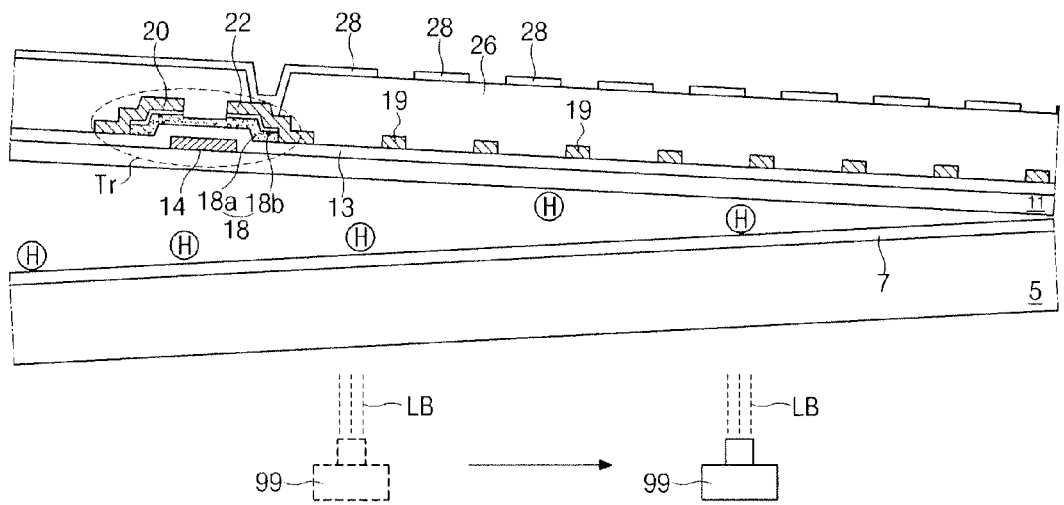

Reference will now be made in detail to the illustrated embodiments of the present invention, which are illustrated in the accompanying drawings.

An inorganic material and a metallic material used for an adhesive adjusting layer between a carrier substrate and a plastic substrate in a method of fabricating a display device according to a first embodiment of the present invention will be illustrated hereinafter.

TABLE 1 shows a contact angle at which a liquid or vapor interface meets the solid surface and an adhesive force between a plastic substrate and various materials.

TABLE 1

| Material | Contact angle (°, degree) | Adhesive force (gf/cm$^2$) |
| --- | --- | --- |
| silicon oxide (SiO$_2$) | 52.4 | 3.39 |
| silicon nitride (SiNx) | 48.1 | 3.58 |
| amorphous indium-tin-oxide (a-ITO) | 6.2 | 554.68 |
| aluminum alloy (e.g., AlNd) | 5.6 | 132.82 |
| copper (Cu) | 2.5 | immeasurable (over 600) |
| molybdenum titanium (MoTi) | 8.7 | 328.54 |

As shown in TABLE 1, the contact angle of the inorganic material such as silicon oxide (SiO$_2$) and silicon nitride (SiNx) with respect to the plastic substrate 110 (of FIG. 3C) is relatively great. For example, the contact angle of an inorganic material with respect to the plastic substrate 110 may be greater than about 45°. Since the inorganic material has a relatively great contact angle with respect to the plastic substrate 110, a cohesive force of the inorganic material to the plastic substrate 110 is relatively small. As a result, an adhesive force of an inorganic material to the plastic substrate 110 is smaller than about 5 gf/cm$^2$.

In addition, the contact angle of the metallic material such as amorphous indium-tin-oxide (a-ITO), aluminum alloy (e.g., AlNd), copper (Cu) and molybdenum titanium (MoTi) with respect to the plastic substrate 110 is relatively small. For example, the contact angle of a metallic material with respect to the plastic substrate 110 may be smaller than about 10°. As a result, an adhesive force of a metallic material to the plastic substrate 110 is greater than about 100 gf/cm$^2$.

Since the inorganic material and the metallic material have different adhesive forces to the plastic substrate 110, an adhesive adjusting layer having an optimum adhesive force to the plastic substrate 110 may be obtained by forming an inorganic material area and a metallic material area with a predetermined ratio. For example, an adhesive force between a carrier substrate 101 (of FIG. 3A) and the plastic substrate 110 may be controlled by forming an adhesive layer 102 (of FIG. 3A) and a plurality of adhesive patterns 105 (of FIG. 3B) between the carrier substrate 101 and the plastic substrate 110 with an area ratio of an inorganic material area to a metallic material area within a range of about 99:1 to about 90:10 in a display area.

When the adhesive layer 102 of the inorganic material having a relatively small adhesive force to the plastic substrate 110 and the plurality of adhesive patterns 105 of the metallic material having a relatively great adhesive force to the plastic substrate 110 are formed to have an area ratio of an inorganic material area to a metallic material area within a range of about 99:1 to about 90:10 in the display area, the adhesive force between the carrier substrate 101 and the plastic substrate 110 may be within a range of about 10 gf/cm$^2$ to about 100 gf/cm$^2$. In an embodiment of the present invention, an average adhesive force between the carrier substrate 101 and the plastic substrate 110 may be about 20 gf/cm$^2$ by controlling the ratio of the inorganic material area to the metallic material area in the display area according to the adhesive layer 102 and the plurality of adhesive patterns 105.

As a comparison example, the adhesive force of a post-it is within a range of about 23 gf/cm$^2$ to about 26 gf/cm$^2$, and an adhesive force of a magic tape is within a range of about 190 gf/cm$^2$ to about 200 gf/cm$^2$. Since the adhesive force between the carrier substrate 101 and the plastic substrate 110 is similar to the adhesive force of the post-it, peeling and separation of the plastic substrate 110 from the carrier substrate 101 are prevented during an array process, and the plastic substrate 110 is easily detached from the carrier substrate 101 by hand or other means such as a clamp after the array process.

Since the carrier substrate 101 made of glass has a flat and smooth surface, the adhesive force between the carrier substrate 101 and the plastic substrate 110 without an intervening layer is within a range of about 7 gf/cm$^2$ to about 8 gf/cm$^2$. As a result, when the plurality of adhesive patterns 105 are omitted in the array process, the plastic substrate 110 may be partially separated from the carrier substrate 101 to cause deterioration of patterns and break of the plastic substrate 110.

In an embodiment of the present invention, the adhesive adjusting layer including the adhesive layer 102 of the inorganic material and the plurality of adhesive patterns 105 of the metallic material may be formed between the carrier substrate 101 and the plastic substrate 110 to have a predetermined ratio of the inorganic material area to the metallic material area in the display area. The plurality of adhesive patterns 105 of the metallic material are formed on the adhesive layer 102 and are arranged in a manner of line shape having a width of about 1 μm to about 500 μm. Further, the ratio of the metallic material area by the plurality of adhesive patterns 105 to the display area of the plastic substrate 110 is less than 10%, for example, within a range of about 1% to about 10%, and the ratio of the inorganic material area by the adhesive layer 102 not overlapped with the plurality of adhesive patterns 105 to the display area is more than about 90%, for example, within a range of about 90% to about 99%. Accordingly, the average adhesive force between the carrier substrate 101 and the plastic substrate 110 may be within a range of about 10 gf/cm$^2$ to about 100 gf/cm$^2$ due to the adhesive adjusting layer. In another embodiment, each of the plurality of adhesive patterns may have a dot shape having a diameter of about 1 μm to about 500 μm, but the present invention is not limited to this.

FIGS. 3A to 3K are cross-sectional views showing a method of fabricating an electrophoretic display device according to a first embodiment of the present invention. A fabrication process for an electrophoretic display device including a plastic substrate may be divided into an array process, a film deposition process and a cell process. A plurality of elements for displaying images such as a gate line, a data line, a thin film transistor, a pixel electrode and an electrophoretic film may be formed on the plastic substrate through the array process and the film deposition process. In addition, the plastic substrate is cut and a carrier substrate is detached from the plastic substrate through the cell process.

Figure 3A:
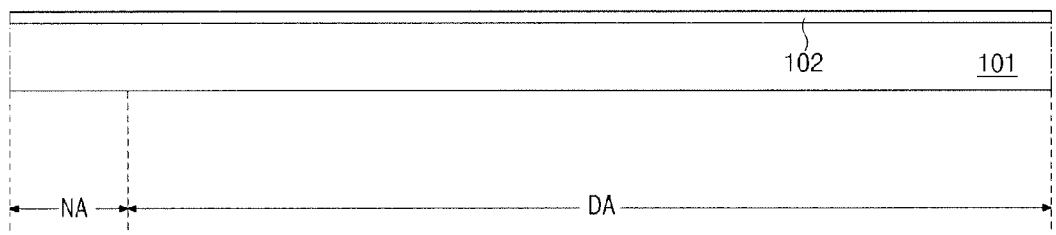
FIGS. 3A to 3K are cross-sectional views showing a method of fabricating an electrophoretic display device according to a first embodiment of the present invention.

In FIG. 3A, an adhesive layer 102 of an inorganic material is formed on a carrier substrate 101 having a display area DA displaying images and a non-display area NA surrounding the display area DA. For example, the inorganic material may include one of silicon oxide ($SiO_2$) and silicon nitride (SiNx), and the carrier substrate 101 may be made of a glass. The adhesive layer 102 may be formed on the carrier substrate 101 by depositing the inorganic material.

Figure 3B:
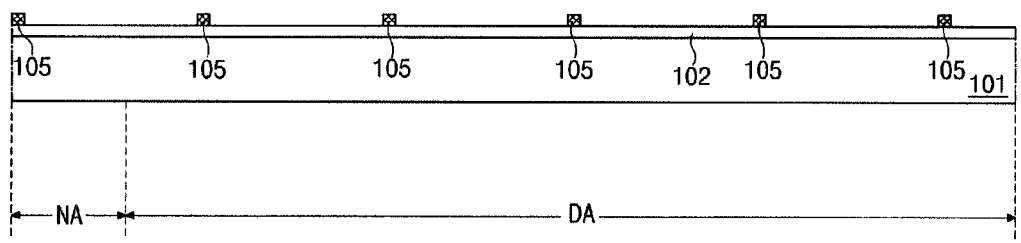

In FIG. 3B, a plurality of adhesive patterns 105 of a metallic material are formed on the adhesive layer 102. For example, the metallic material may include one of molybdenum (Mo), molybdenum tungsten (MoW), aluminum (Al), aluminum alloy such as aluminum neodymium (e.g. AlNd), copper (Cu), molybdenum titanium (MoTi), amorphous indium-tin-oxide (a-ITO) and indium-gallium-zinc-oxide (IGZO). After a first metal layer (not shown) is formed on the adhesive layer 102 by depositing the metallic material, the first metal layer may be patterned by coating a photoresist, exposing the photoresist, etching the first metal layer and stripping the photoresist to form the plurality of adhesive patterns 105. The plurality of adhesive patterns 105 may be arranged in a manner of stripe or matrix shape or dot shape and may constitute unevenly on the adhesive layer 102.

When the plurality of adhesive patterns 105 are arranged in stripe or matrix shape, each of the plurality of adhesive patterns 105 may have a width of about 1 μm to about 500 μm and a height of about 50 Å to about 150 Å. When each of the plurality of adhesive patterns 105 has a width smaller than about 1 μm, the plastic substrate 11 may be easily separated from the carrier substrate 101 during the array process because the adhesive force between the carrier substrate 101 and a plastic substrate 110 (of FIG. 3C) is too weak. As a result, the array process may not be completed. In addition, when each of the plurality of adhesive patterns 105 has a width greater than about 500 μm, the plastic substrate 110 may be broken while the plastic substrate 110 is detached from the carrier substrate 101 after the array process because the adhesive force between the carrier substrate 101 and the plastic substrate 110 is too strong. Since the tensile force for detaching the plastic substrate 110 from the carrier substrate 101 should be greater than the adhesive force between the carrier substrate 101 and the plastic substrate 110, the plastic substrate 110 may be torn due to the tensile force.

Figure 3C:
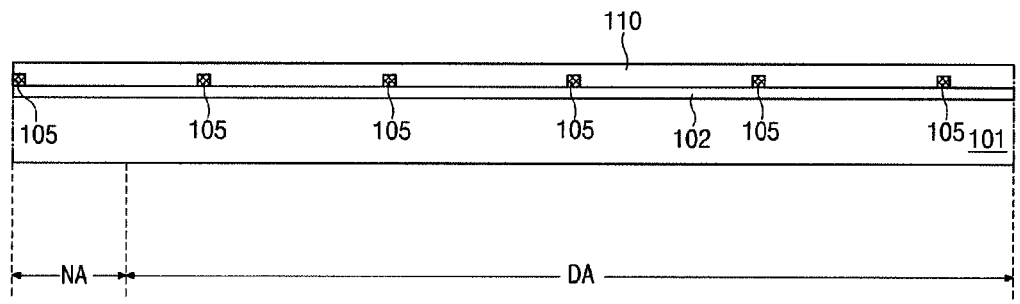

In FIG. 3C, after a plastic layer (not shown) is formed on the adhesive layer 102 and the plurality of adhesive patterns 105 by coating a liquid plastic, the plastic layer is cured by a heat or an ultraviolet (UV) ray to form the plastic substrate 110. The plastic substrate 110 has a thickness of about 10 μM to about 100 μm. The plastic substrate 110 functions as a base substrate for a display device such as an electrophoretic display (EPD) device.

Figure 3D:
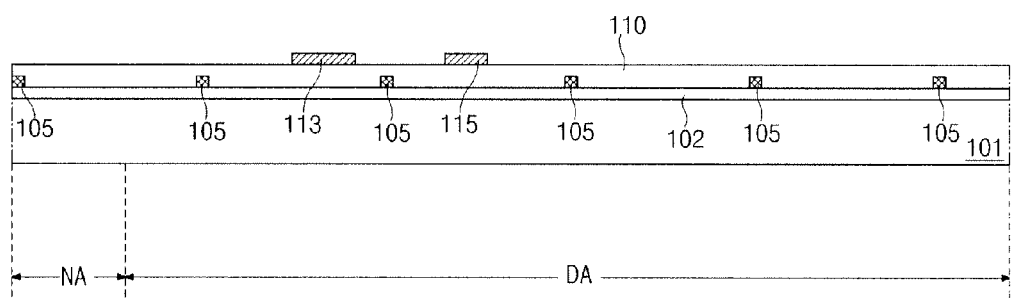

In FIG. 3D, after a second metal layer (not shown) is formed on the plastic substrate 110 by depositing a metallic material such as aluminum (Al), aluminum (Al) alloy, copper (Cu), copper (Cu) alloy, chromium (Cr) and titanium (Ti) alloy, a gate line (not shown), a gate electrode 113 connected to the gate line and a first capacitor electrode 115 are formed in the display area DA on the plastic substrate 110 by patterning the second metal layer. The first capacitor electrode 115 may be a portion of a common line (not shown) parallel to the gate line and a previous gate line. In the first embodiment, the first capacitor electrode 115 is a portion of the common line.

Figure 3E:
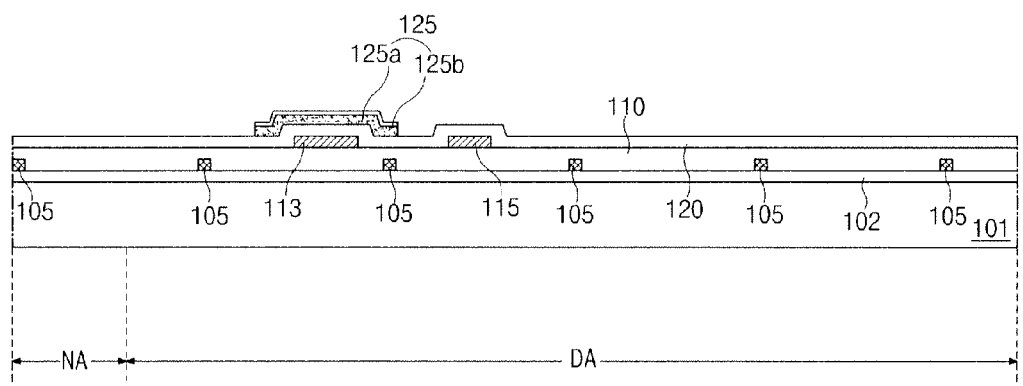

In FIG. 3E, a gate insulating layer 120 is formed on the gate line, gate electrode 113 and the first capacitor electrode 115 by depositing an inorganic insulating material such as silicon oxide ($SiO_2$) and silicon nitride (SiNx). After an intrinsic amorphous silicon layer (not shown) and an impurity-doped amorphous silicon layer (not shown) are formed on the gate insulating layer 120 by sequentially depositing intrinsic amorphous silicon and impurity-doped amorphous silicon, an active layer 125a and an impurity-doped amorphous silicon pattern 125b are formed on the gate insulating layer 120 over the gate electrode 113 by patterning the impurity-doped amorphous silicon layer and the intrinsic amorphous silicon layer.

Figure 3F:
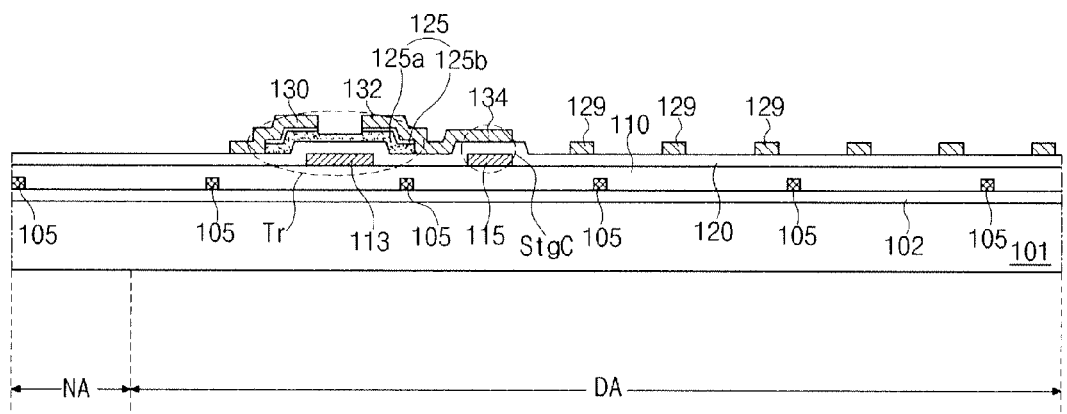

In FIG. 3F, after a third metal layer (not shown) is formed on the gate insulating layer 120, the active layer 125a and the impurity-doped amorphous silicon pattern 125b by depositing a metallic material such as molybdenum (Mo), copper (Cu), titanium (Ti) alloy and aluminum (Al) alloy, a data line 129, a source electrode 130, a drain electrode 132 and a second capacitor electrode 134 are formed in the display area DA by patterning the third metal layer. The data line 129 crosses the gate line and the source electrode 130 is connected to the data line 129. The source and drain electrodes 130 and 132 are spaced apart from each other on the impurity-doped amorphous silicon pattern 125b. The second capacitor electrode 134 is connected to the drain electrode 132 and is formed on the gate insulating layer 120 to correspond to the first capacitor electrode 115. The first and second capacitor electrodes 115 and 134 and the gate insulating layer 120 between the first and second capacitor electrodes 115 and 134 constitute a storage capacitor StgC. Further, the gate electrode 113, the gate insulating layer 120, the semiconductor layer 125, the source electrode 130 and the drain electrode 132 constitute a thin film transistor (TFT) Tr.

In addition, a portion of the impurity-doped amorphous silicon pattern 125b not overlapped with the source and drain electrodes 130 and 132 is removed through a dry etching method so that the active layer 125a between the source and drain electrodes 130 and 132 can be exposed. As a result, an ohmic contact layer 125b contacting the source and drain electrodes 130 and 132 is formed on the active layer 125a. The active layer 125a and the ohmic contact layer 125b constitute a semiconductor layer 125.

Although the semiconductor layer 125 and the source and drain electrodes 130 and 132 are formed through a two-mask process in the first embodiment, the semiconductor layer 125 and the source and drain electrodes 130 and 132 may be formed through a one-mask process in another embodiment. For example, after an intrinsic amorphous silicon layer, an impurity-doped amorphous silicon layer and a third metal layer are sequentially formed on the gate insulating layer 120, a photoresist pattern including portions of different thicknesses may be formed on the third metal layer using a photo mask having a transmissive area, a blocking area and a half-transmissive area. The half-transmissive area may be formed by a diffraction pattern such as a slit or a halftone pattern. The intrinsic amorphous silicon layer, the impurity-doped amorphous silicon layer and the third metal layer are patterned using the photoresist pattern as an etching mask to form an active layer. After the photoresist pattern is partially removed by an ashing method, the impurity-doped amorphous silicon layer and the third metal layer are patterned using the partially removed photoresist pattern as an etching mask to form an ohmic contact layer and source and drain electrodes. Since the semiconductor layer including the intrinsic amorphous silicon layer and the impurity-doped amorphous silicon layer and the third metal layer are patterned using the single photo mask, a semiconductor pattern is formed between a data line and the gate insulating layer 120.

Figure 3G:
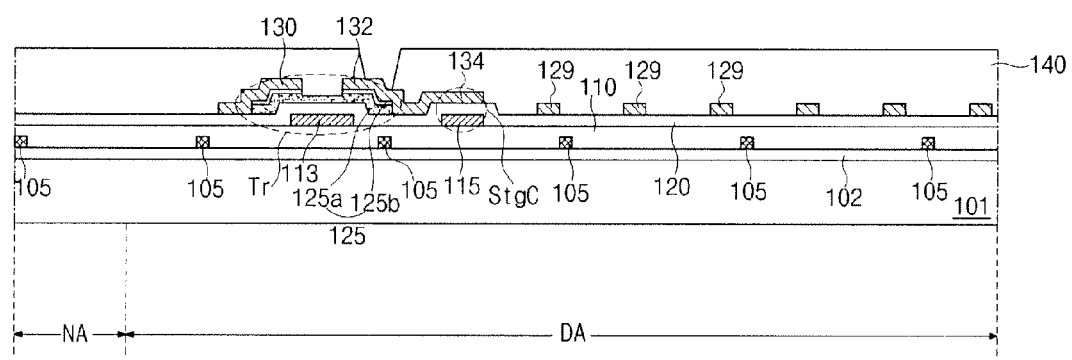

In FIG. 3G, a passivation layer 140 is formed on the data line 129, the source electrode 130, the drain electrode 132 and the second capacitor electrode 134 by depositing an organic insulating material such as benzocyclobutene (BCB) and acrylic resin. The passivation layer 140 may planarize the plastic substrate 110 having the data line 129, the TFT Tr and the storage capacitor StgC to have a flat top surface. Next, the passivation layer 140 is patterned and a drain contact hole exposing the drain electrode 132 of the TFT Tr is formed in the passivation layer 140.

In another embodiment, a first auxiliary passivation layer may be formed under the passivation layer 140 by depositing an inorganic insulating material such as silicon oxide ($SiO_2$) and silicon nitride (SiNx), and a second auxiliary passivation layer may be formed on the passivation layer 140 by depositing an inorganic insulating material such as silicon oxide ($SiO_2$) and silicon nitride (SiNx). Since the contact property of the organic insulating material is poor as compared with the contact property of the inorganic insulating material, the contact between the actively layer 125a and the passivation layer 140 may degrade characteristics of the TFT Tr. Accordingly, the characteristics of the TFT Tr are improved by using the first auxiliary passivation layer between the active layer 125a and the passivation layer 140. Further, the contact property of a pixel electrode 150 (of FIG. 3H) is improved by using the second auxiliary passivation layer between the passivation layer 140 and the pixel electrode 150.

Figure 3H:
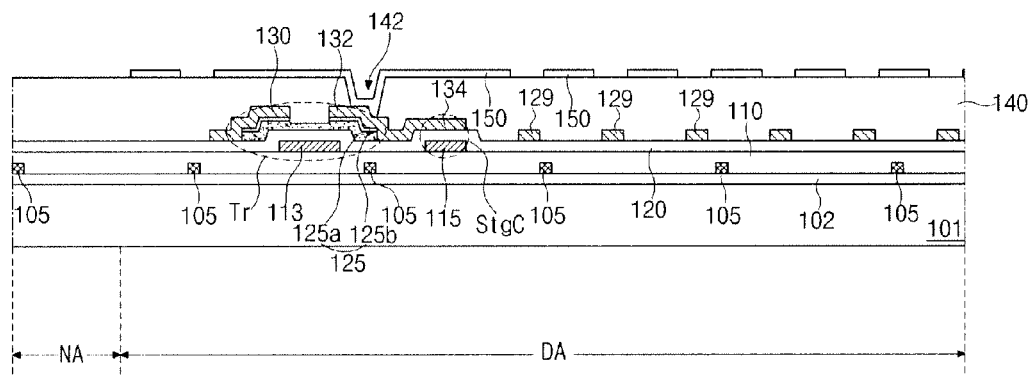

In FIG. 3H, after a transparent conductive layer (not shown) is formed on the passivation layer 140 by depositing a transparent conductive material such as indium-tin-oxide (ITO), indium-zinc-oxide (IZO) and indium-tin-zinc-oxide (ITZO), a pixel electrode 150 connected to the drain electrode 132 through the drain contact hole 142 is formed on the passivation layer 140 in the display area DA by patterning the transparent conductive layer.

Figure 3I:
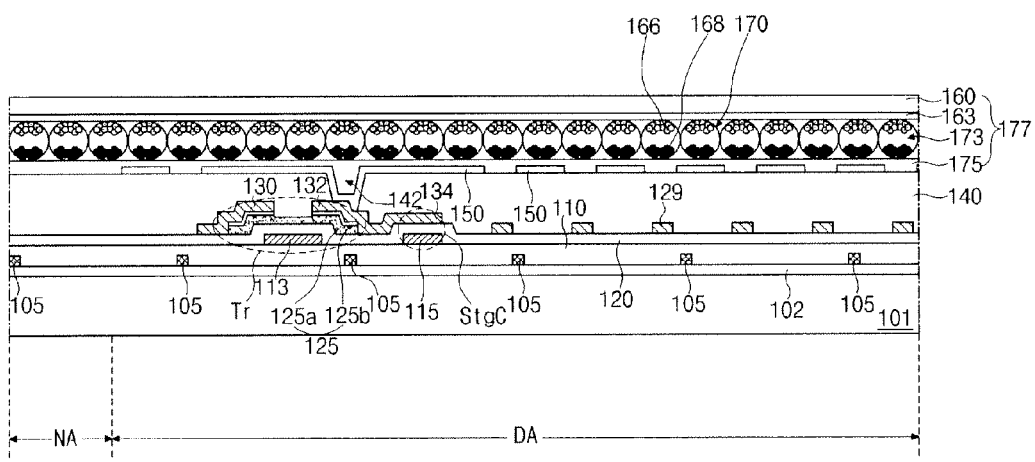

In FIG. 3I, an electrophoretic film 177 is formed on the pixel electrode 150. The electrophoretic film 177 includes a base film 160, a common electrode 163 on the base film 160, an ink layer 173 on the common electrode 163 and an adhesive layer 175 on the ink layer 173. The base film 160 includes a flexible material such as polyethylene terephthalate (PET) and the common electrode 163 includes a transparent conductive material. The ink layer 173 includes a plurality of capsules 170, and each of the plurality of capsules 170 includes a plurality of white pigments 166 and a plurality of black pigments 168. The plurality of white pigments 166 and the plurality of black pigments 168 may be charged by condensation polymerization (polycondensation). For example, the plurality of white pigments 166 may be charged negatively and the plurality of black pigments 168 may be charged positively. The plurality of capsules 170 may have a uniform size through a filtering process. The adhesive layer 175 of the electrophoretic film 177 may be attached to the pixel electrode 150 of the plastic substrate 110 such that the ink layer 173 is disposed between the pixel electrode 150 and the common electrode 163.

Figure 3J:
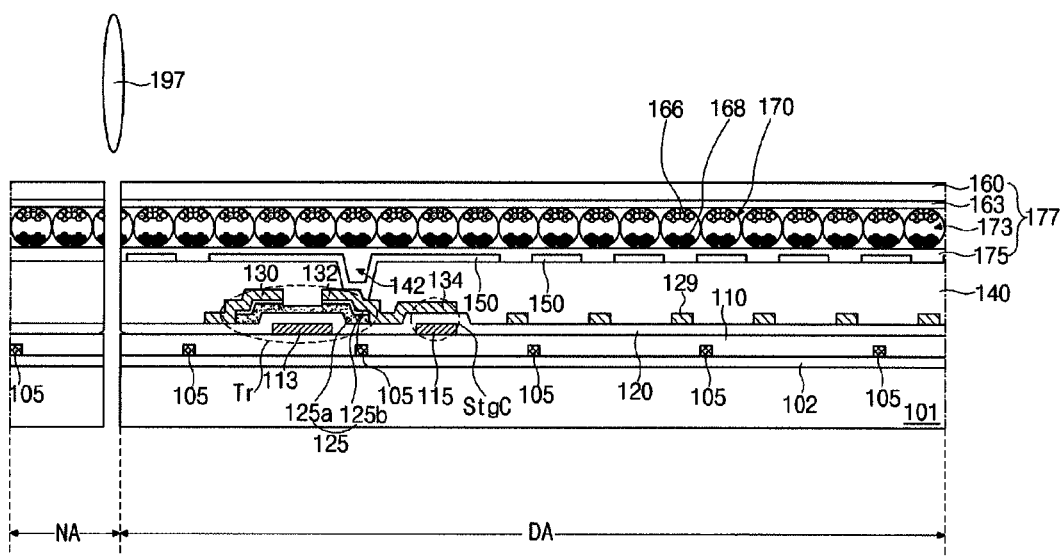

In FIG. 3J, the plastic substrate 110 having the electrophoretic film 177 over the carrier substrate 101 is cut along a scribing line SL (of FIG. 4A) in the non-display area NA by a cutting wheel 197 of a scribing apparatus (not shown). At a portion corresponding to the scribing line SL, since the adhesive layer 102 is disposed between the carrier substrate 101 and the plastic substrate 110 without the plurality of adhesive patterns 105, the adhesive force between the carrier substrate 101 and the plastic substrate 110 is relatively small. As a result, after the plastic substrate 110 is cut, the plastic substrate 110 may be peeled or separated from the carrier substrate 101 at the cutting surface by an external force from the cutting wheel 197.

Figure 3K:
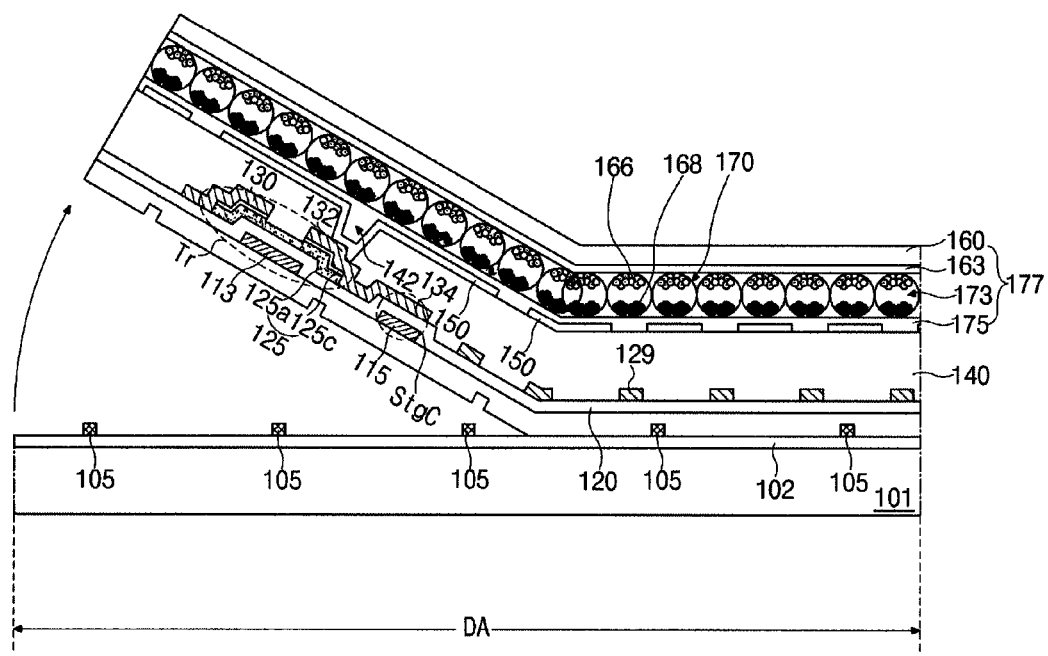

In FIG. 3K, after the plastic substrate 110 is fixed by a vacuum or a clamp, the carrier substrate 101 is detached from the plastic substrate 110 by applying a force gradually. In another embodiment, the detachment between the carrier substrate 101 and the plastic substrate 110 may be performed manually without using an apparatus such as clamp.

Since the detachment between the carrier substrate 101 and the plastic substrate 110 is completed within about 20 seconds, the process time for the detachment step of the first embodiment is reduced as compared with the process time for the detachment step of the related art using a laser beam and productivity is improved.

In another embodiment, the detachment between the carrier substrate 101 and the plastic substrate 110 may be performed may be performed before the electrophoretic film 177 is formed on the pixel electrode 150 of the plastic substrate 110. In addition, after the electrophoretic film 177 is formed on the pixel electrode 150, a color filter layer and a protecting layer may be formed on the base film 160 to obtain a full color EPD device. The color filter layer may include red, green and blue color filters in a pixel region. In addition, the detachment between the carrier substrate 101 and the plastic substrate 110 may be performed after the color filter layer and the protecting layer are formed on the base film 160.

Figure 4A:
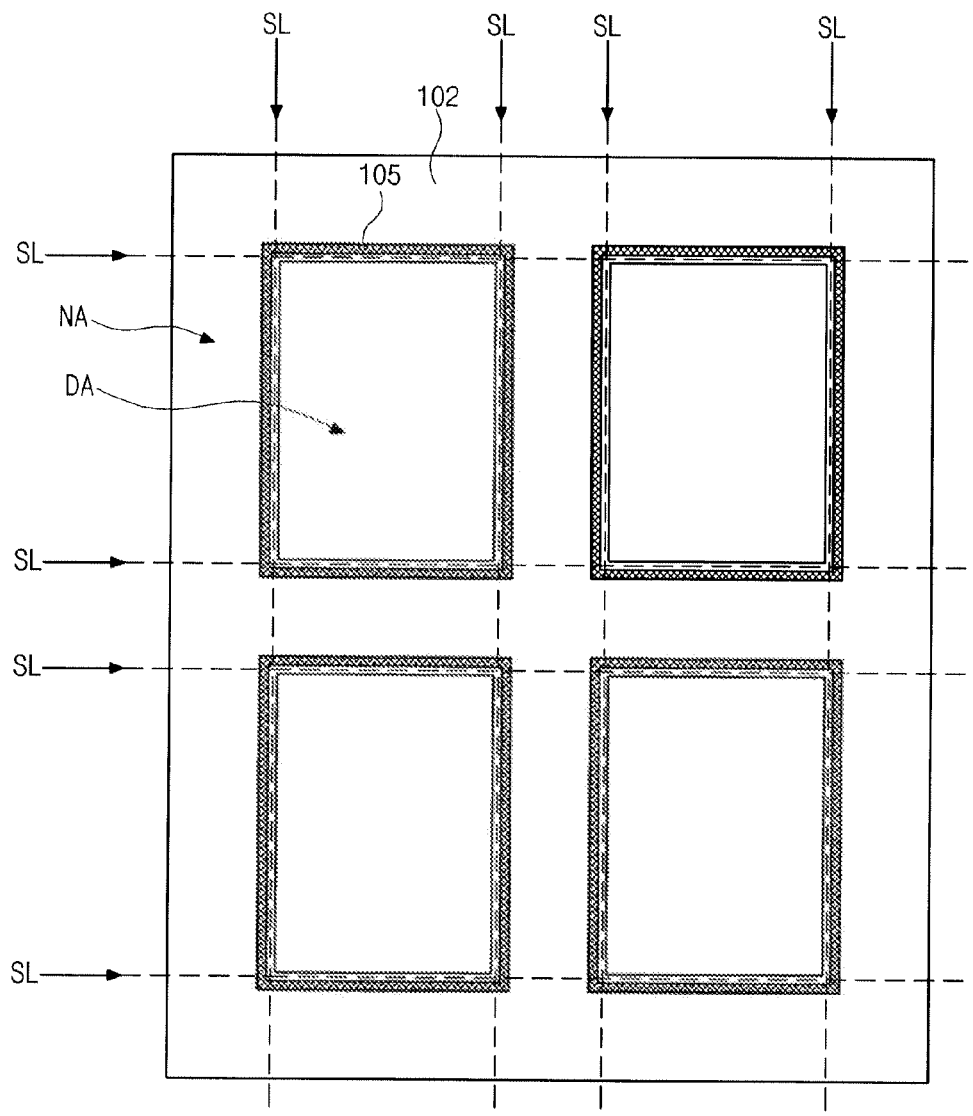
FIGS. 4A to 4C are plane views showing a plurality of adhesive patterns of an electrophoretic display device according to a first embodiment of the present invention.
Figure 4B:
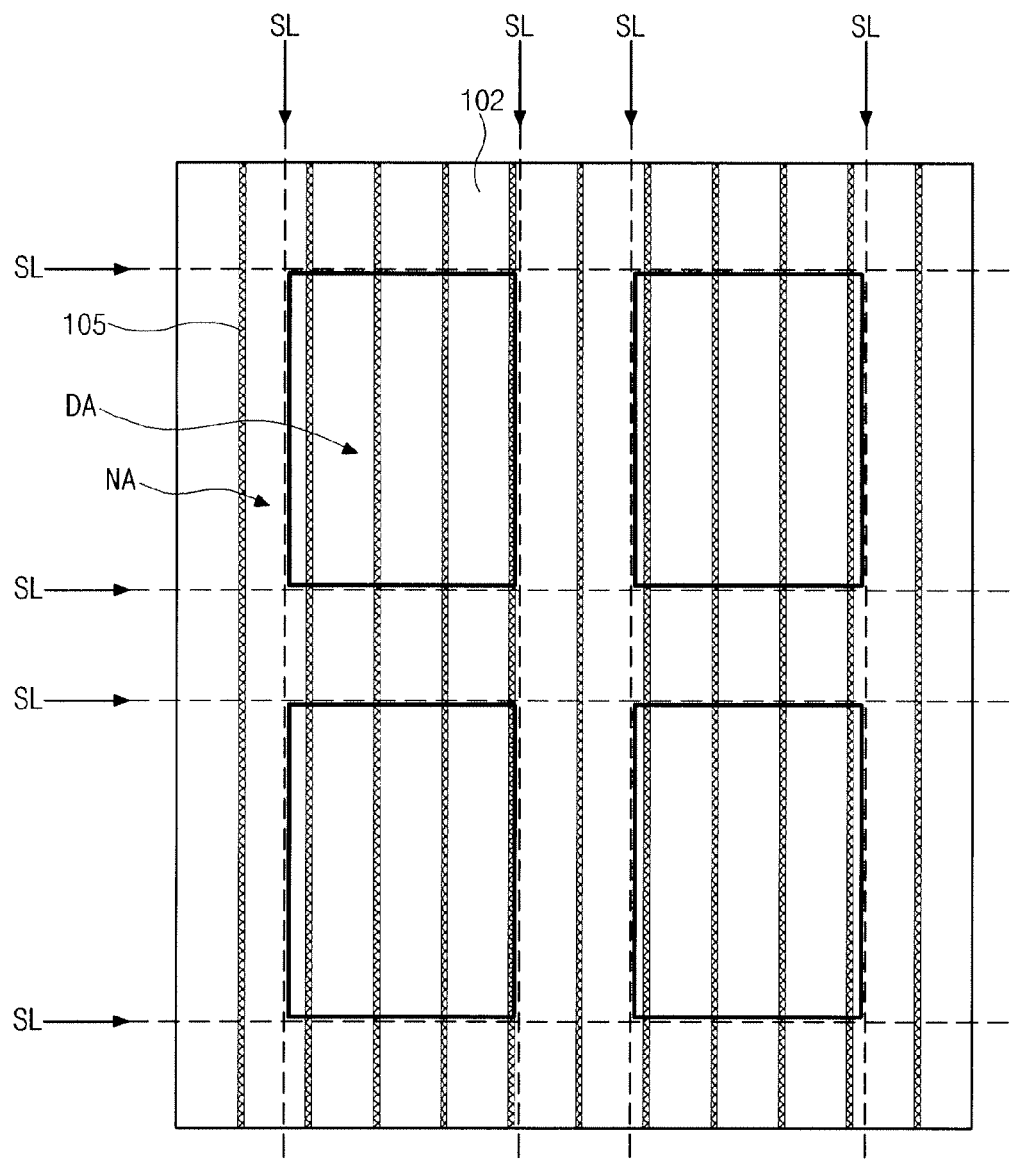
Figure 4C:
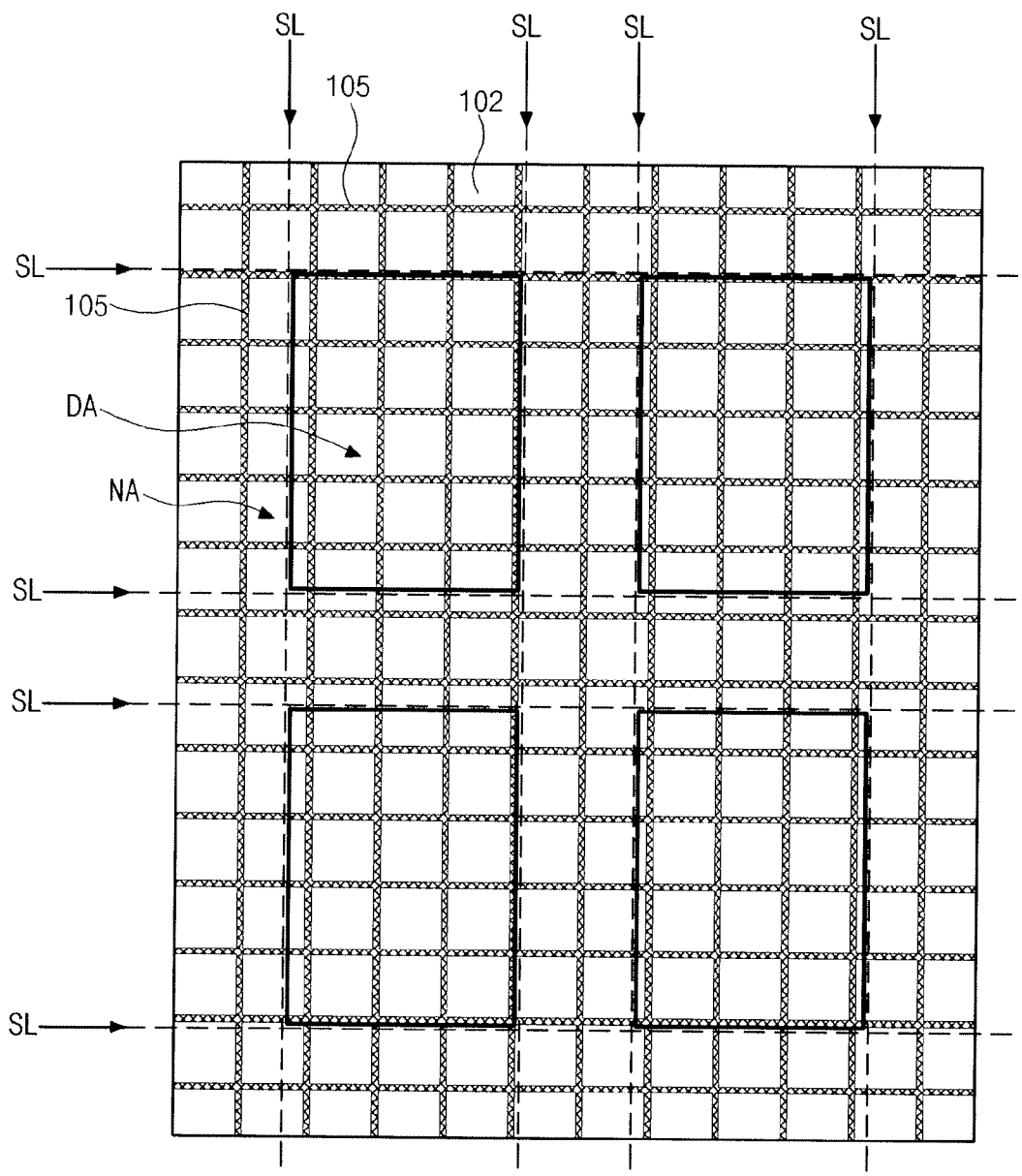

FIGS. 4A to 4C are plane views showing a plurality of adhesive patterns of an electrophoretic display device according to a first embodiment of the present invention. In FIGS. 4A to 4C, a plurality of display areas DA each having a rectangular shape and a non-display area NA surrounding the plurality of display area DA are defined in a carrier substrate 101 (of FIG. 3A).

In FIG. 4A, a plurality of adhesive patterns 105 each having a rectangular ring shape is formed on an adhesive layer 102 outside the plurality of display area DA and a plurality of scribing lines SL are disposed between each display area DA and each adhesive pattern 105.

In FIG. 4B, a plurality of adhesive patterns 105 spaced apart from each other is formed on an adhesive layer 102 to have a stripe type. A plurality of scribing lines SL are defined to be disposed outside each display area DA.

In FIG. 4C, a plurality of adhesive patterns 105 is formed on an adhesive layer 102 to have a matrix shape, and a plurality of scribing lines SL are defined to be disposed outside each display area DA. In another embodiment, a plurality of adhesive patterns 105 may have a random dot shape.

As shown in FIGS. 4A to 4C, the adhesive layer 102 is exposed out of the plurality of adhesive patterns 105. In a plane view, a total area corresponding to the exposed portion of the adhesive layer 102 of an inorganic material may be defined as an inorganic material area, and the plurality of adhesive patterns 105 of a metallic material may be defined as a metallic material area. In the first embodiment, an area ratio of the inorganic material area to the metallic material area in the display area DA may be within a range of about 99:1 to about 90:10 for an optimum adhesive force.

In a method of fabricating an electrophoretic display device according to a first embodiment of the present invention, an adhesive layer 102 of an inorganic material is formed on a carrier substrate 101 and a plurality of adhesive patterns 105 having a predetermined width and a predetermined height are formed on the adhesive layer 102. Accordingly, the plastic substrate 110 and the carrier substrate 101 are stably attached to each other during the array process, and the carrier substrate 101 is easily detached from the plastic substrate 110 by hand or means such as a clamp after the array process is completed.

In another embodiment, an adhesive improving material is used for an adhesive adjusting layer to obtain an optimum adhesive force.

Figure 5A:
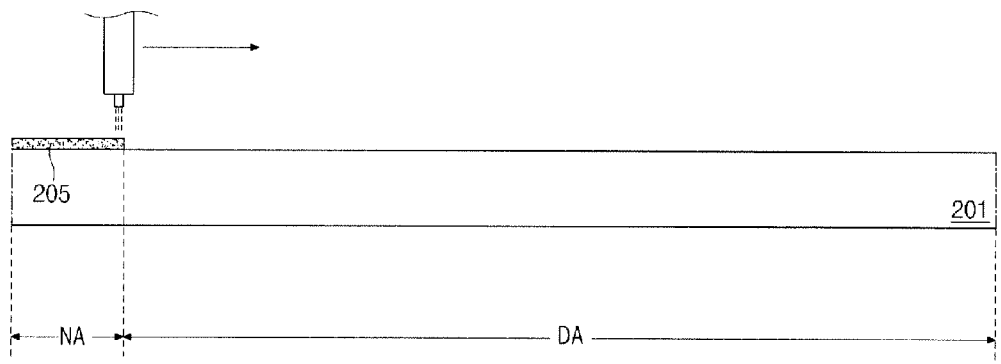
FIGS. 5A to 5C are cross-sectional views showing a method of fabricating an electrophoretic display device according to a second embodiment of the present invention.
Figure 5B:
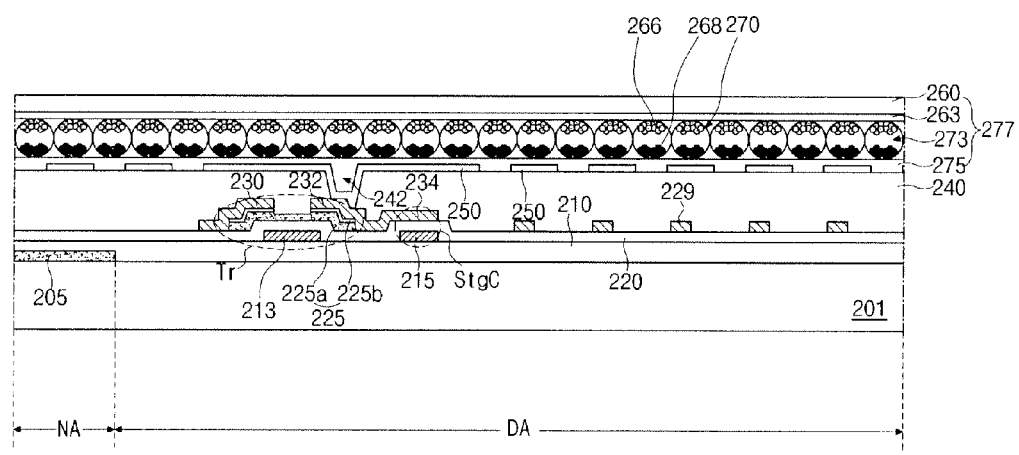
Figure 5C:
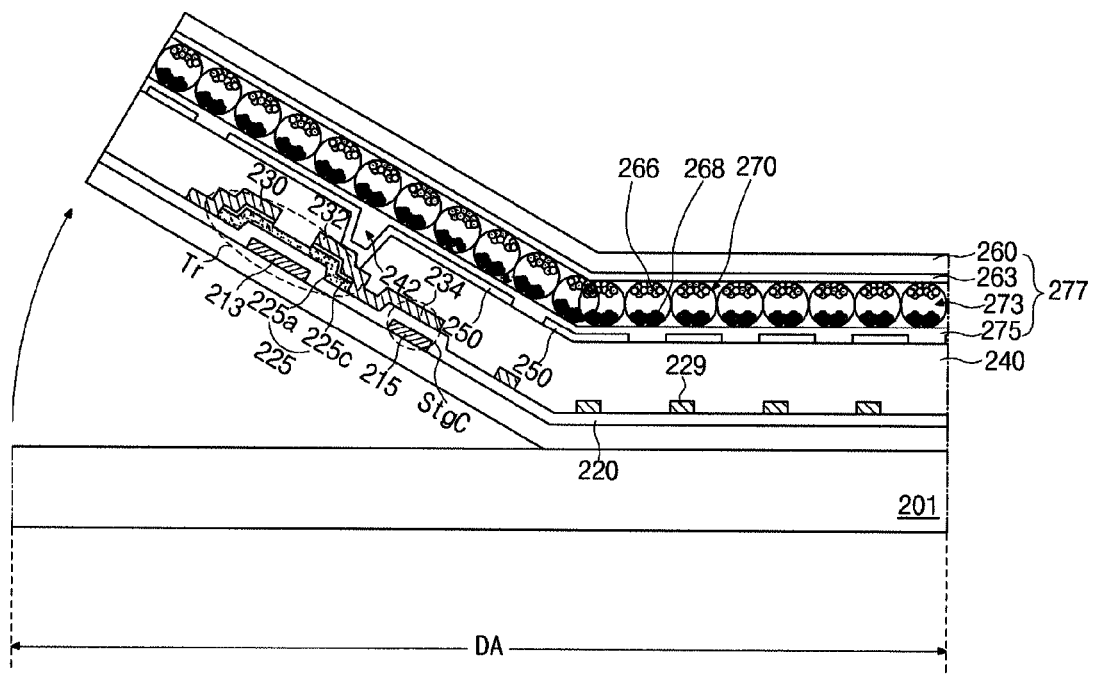

FIGS. 5A to 5C are cross-sectional views showing a method of fabricating an electrophoretic display device according to a second embodiment of the present invention.

In FIG. 5A, an adhesive adjusting layer 205 is formed on a carrier substrate 201 by dispensing an adhesive improving material with a syringe 298 in a spraying process. In another embodiment, the adhesive adjusting layer 205 may be formed by coating the adhesive improving material with a brush or a roller in a coating or rolling process. The adhesive adjusting layer 205 may be dried by heat and may have a predetermined pattern.

The adhesive improving material may include an amino silane material ($(RO)_3$—Si—R'—$NH_2$) and an organic solvent such as 1-methoxy-2-propanol. Further, the amino silane material may be within a range of about 0.1% to about 10% by weight and the organic solvent may be within a range of about 90% to about 99.9% by weight. In addition, an adhesive force between the carrier substrate 201 and a plastic substrate 210 (of FIG. 5C) may be within a range of about 10 gf/cm$^2$ to about 100 gf/cm$^2$ by the adhesive adjusting layer 205.

The carrier substrate 201 includes a display area DA and a non-display area NA surrounding the display area DA, and the adhesive adjusting layer 205 is formed to be disposed in the non-display area NA. Accordingly, the adhesive adjusting layer 205 is removed after the carrier substrate 201 is cut along a scribing line. The adhesive adjusting layer 205 may be formed in the whole non-display area NA or may be partially formed in the non-display area NA. For example, the adhesive adjusting layer 205 may have a rectangular ring shape in the non-display area NA surrounding the display area DA.

In FIG. 5B, a plastic substrate 210 is formed on the adhesive adjusting layer 205 and the carrier substrate 201. A gate line (not shown), a data line 229 and a thin film transistor (TFT) Tr including a gate electrode 213, a gate insulating layer 220, a semiconductor layer 225, a source electrode 230 and a drain electrode 232 are formed on the plastic substrate 210 and a passivation layer 240 is formed on the data line 229 and the TFT Tr. In addition, a pixel electrode 250 is formed on the passivation layer 240, and an electrophoretic film 277 including a base film 260, a common electrode 263, an ink layer 273 and an adhesive layer 275 is formed on the pixel electrode 250. The base film 260 includes a flexible material such as polyethylene terephthalate (PET) and the common electrode 263 includes a transparent conductive material. The ink layer 273 includes a plurality of capsules 270, and each of the plurality of capsules 270 includes a plurality of white pigments 266 and a plurality of black pigments 268. The plurality of white pigments 266 and the plurality of black pigments 268 may be charged by condensation polymerization (polycondensation). The adhesive layer 275 of the electrophoretic film 277 may be attached to and contact the pixel electrode 250 of the plastic substrate 210 such that the ink layer 273 is disposed between the pixel electrode 250 and the common electrode 263.

In FIG. 5C, after the plastic substrate 210 having the electrophoretic film 277 over the carrier substrate 201 is cut along a scribing line in the non-display area NA, the plastic substrate 210 is fixed by a vacuum or a clamp, the carrier substrate 201 is detached from the plastic substrate 210 by applying a force gradually. Since the adhesive adjusting layer 205 provides an optimum adhesive force between the plastic substrate 210 and the carrier substrate 201, the plastic substrate 210 and the carrier substrate 201 are stably attached to each other during the array process, and the carrier substrate 201 is easily detached from the plastic substrate 210 by hand or means such as a clamp after the array process is completed.

When a color filter layer and a protecting layer are formed on the base film 360 to obtain a full color EPD device, the detachment between the carrier substrate 201 and the plastic substrate 210 may be performed after the color filter layer and the protecting layer are formed on the base film 360.

Figure 6:
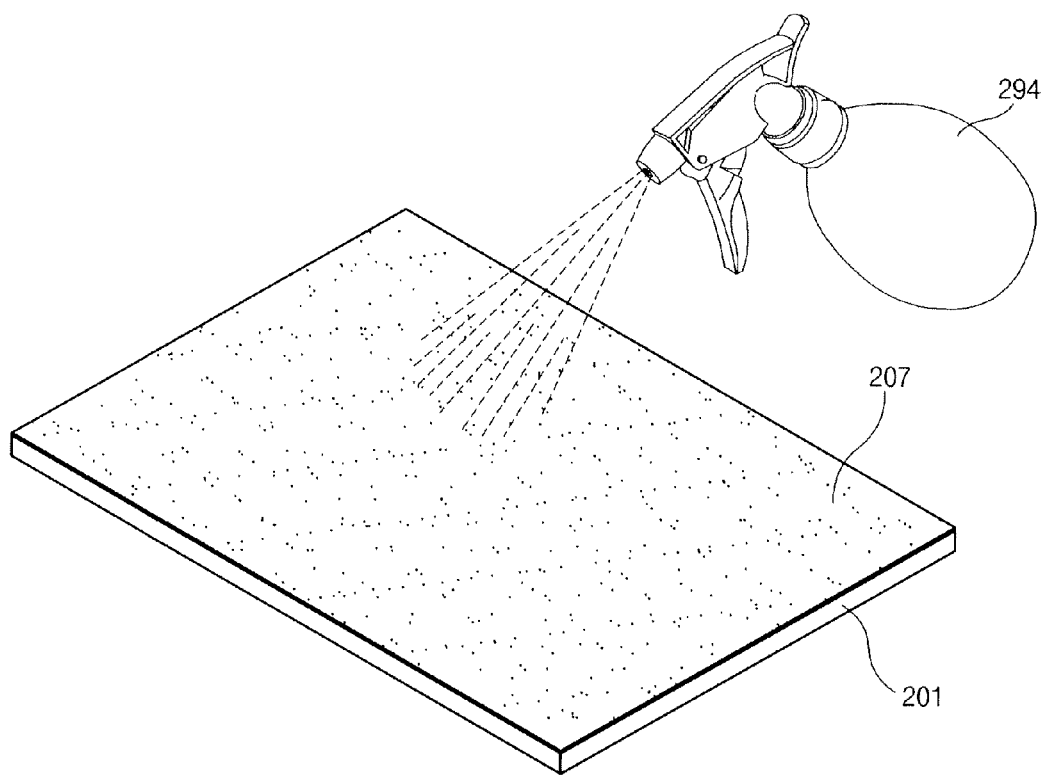
FIG. 6 is a perspective view showing a method of fabricating an electrophoretic display device according to a third embodiment of the present invention.

FIG. 6 is a perspective view showing a method of fabricating an electrophoretic display device according to a third embodiment of the present invention.

In FIG. 6, an adhesive adjusting layer 207 is formed on a whole carrier substrate 201 by spraying an adhesive improving material with a spray 294. An adhesive force between the carrier substrate 201 and the plastic substrate (not shown) may be determined according to the composition ratio of the adhesive improving material and the amount of the sprayed adhesive improving material.

As in the second embodiment, the adhesive improving material may include about 0.1% to about 10% by weight of an amino silane material ($(RO)_3$—Si—R'—$NH_2$) and about 90% to about 99.9% by weight of an organic solvent such as 1-methoxy-2-propanol. In addition, the adhesive force between the carrier substrate 201 and the plastic substrate may be within a range of about 10 gf/cm$^2$ to about 100 gf/cm$^2$ by the adhesive adjusting layer 207. For example, when the adhesive improving material including about 1% by weight of an amino silane material ($(RO)_3$—Si—R'—$NH_2$) and about 99% by weight of 1-methoxy-2-propanol is used for the adhesive adjusting layer 207, the adhesive force between the carrier substrate 201 and the plastic substrate may be 20 gf/cm$^2$.

In the first to third embodiments of the present invention, an electrophoretic display device is formed on the plastic substrate attached to the carrier substrate. In another embodiment, the other display device such as a liquid crystal display (LCD) device and an organic electroluminescent display (OELD) device may be formed on the plastic substrate attached to the carrier substrate using the adhesive adjusting layer or the adhesive adjusting pattern, and the carrier substrate may be detached from the plastic substrate without using a laser apparatus after the array process is completed.

A fabrication process for an LCD device including a plastic substrate may be divided into an array process, a color filter process and a cell process. A plurality of elements for displaying images such as a gate line, a data line, a thin film transistor, a pixel electrode, a common electrode, a color filter layer and a liquid crystal layer may be formed on the plastic substrate through the array process and the color filter process. In addition, the plastic substrate is cut and a carrier substrate is detached from the plastic substrate through the cell process.

Further, a fabrication process for an OELD device including a plastic substrate may be divided into an array process and a cell process. A plurality of elements for displaying images such as a gate line, a data line, a thin film transistor and an organic electroluminescent diode may be formed on the plastic substrate through the array process, and the plastic substrate is cut and a carrier substrate is detached from the carrier substrate through the cell process.

It will be apparent to those skilled in the art that various modifications and variations can be made in the method of fabricating a display device using a plastic substrate of the present invention without departing from the spirit or scope of the invention. Thus, it is intended that the present invention cover the modifications and variations of this invention provided they come within the scope of the appended claims and their equivalents.

What is claimed is:

1. A method of fabricating a display device, comprising:
    forming an adhesive layer of an inorganic material on a carrier substrate having a display area and a non-display area surrounding the display area;
    forming a plurality of adhesive patterns of a metallic material on the adhesive layer, each of the plurality of adhesive patterns having a width and a height;
    forming a plastic substrate on the adhesive layer and the plurality of adhesive patterns;
    forming a plurality of elements for displaying images on the plastic substrate;
    cutting the carrier substrate and the plastic substrate to divide the display area and the non-display area; and
    detaching the carrier substrate from the plastic substrate,
    wherein an adhesive force of the adhesive layer to the plastic substrate is weaker than an adhesive force of the adhesive patterns to the plastic substrate.

2. The method according to claim 1, wherein the carrier substrate is made of glass, the inorganic material includes one of silicon oxide (SiO2) and silicon nitride (SiNx), and the metallic material includes one of molybdenum (Mo), molybdenum tungsten (MoW), aluminum (Al), aluminum alloy, copper (Cu), molybdenum titanium (MoTi), amorphous indium-tin-oxide (a-ITO) and indium-gallium-zinc-oxide (IGZO).

3. The method according to claim 2, wherein the width is within a range of about 1 µm to about 500 µm, and the height is within a range of about 50 Å to about 150 Å.

4. The method according to claim 3, wherein an area ratio of the plurality of adhesive patterns to the display area is within a range of about 1% to about 10%.

5. The method according to claim 4, wherein an average adhesive force between the carrier substrate and the plastic substrate is within a range of about 10 gf/cm2 to about 100 gf/cm2.

6. The method according to claim 1, wherein each of the plurality of adhesive patterns has a rectangular ring shape in the non-display area to surround the display area.

7. The method according to claim 3, wherein each of the plurality of adhesive patterns is arranged in a manner of stripe or matrix shape.

8. The method according to claim 1, wherein forming the plurality of elements comprises:
    forming a gate line, a data line crossing the gate line to define a pixel region and a thin film transistor on the plastic substrate, the thin film transistor including a gate electrode, a gate insulating layer, a semiconductor layer, a source electrode and a drain electrode;
    forming a passivation layer on the thin film transistor, the passivation layer having a drain contact hole exposing the drain electrode; and
    forming a pixel electrode in the pixel region on the passivation layer, the pixel electrode connected to the drain electrode through the drain contact hole.

9. The method according to claim 8, wherein forming the plurality of elements further comprises:
    forming an electrophoretic film on the pixel electrode;
    forming a color filter layer on the electrophoretic film; and
    forming a protecting layer on the color filter layer.

10. The method according to claim 9, wherein the electrophoretic film includes an bonding layer on the pixel electrode, an ink layer on the bonding layer, a common electrode on the ink layer and a base film on the common electrode, the ink layer including a plurality of capsules each having a plurality of white pigments and a plurality of black pigments charged by condensation polymerization.

11. A method of fabricating a display device, comprising:
    forming an inorganic material layer on a carrier substrate having a display area and a non-display area surrounding the display area;
    forming an adhesive pattern on the inorganic material layer, the adhesive pattern is configured to reinforce an adhesive force of the inorganic material layer to a plastic;
    forming a plastic substrate on the inorganic material layer and the adhesive pattern;
    forming a plurality of elements for displaying images on the plastic substrate;
    dividing the display area and the non-display area; and
    detaching the carrier substrate from the plastic substrate,
    wherein an adhesive force of the inorganic material layer to the plastic substrate is weaker than adhesive force of the adhesive pattern to the plastic substrate.

12. The method according to claim 11, wherein the adhesive pattern is made of metal material.

13. The method according to claim 11, wherein the adhesive pattern has a dot shape.

14. The method according to claim 13, wherein an area ratio of the adhesive pattern to the display area is within a range of about 1% to about 10%.

15. The device according to claim 13, wherein the adhesive pattern has a radius of about 1 µm to about 500 µm.

* * * * *